United States Patent
Shu et al.

(10) Patent No.: US 9,898,228 B2
(45) Date of Patent: Feb. 20, 2018

(54) WRITE METHOD AND WRITE APPARATUS FOR STORAGE DEVICE

(71) Applicant: HUAWEI TECHNOLOGIES CO.,LTD., Shenzhen, Guangdong (CN)

(72) Inventors: Jiwu Shu, Beijing (CN); Jie Fan, Beijing (CN); Guanyu Zhu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/159,613

(22) Filed: May 19, 2016

(65) Prior Publication Data

US 2016/0266847 A1  Sep. 15, 2016

Related U.S. Application Data

(63) Continuation of application No. PCT/CN2014/091069, filed on Nov. 14, 2014.

(30) Foreign Application Priority Data

Nov. 22, 2013  (CN) .......................... 2013 1 0597968

(51) Int. Cl.
*G06F 3/06* (2006.01)
*G11C 29/08* (2006.01)
(Continued)

(52) U.S. Cl.
CPC .......... *G06F 3/0659* (2013.01); *G06F 3/0619* (2013.01); *G06F 3/0673* (2013.01);
(Continued)

(58) Field of Classification Search
CPC .... G06F 3/0659; G06F 3/0619; G06F 3/0673; G06F 11/1008; G11C 13/0035; G11C 29/08
(Continued)

(56) References Cited

U.S. PATENT DOCUMENTS 5,533,194 A  7/1996  Albin et al.
7,073,106 B2  7/2006  Paredes et al.
(Continued)

FOREIGN PATENT DOCUMENTS

CN  101447234 A  6/2009
CN  102117662 A  7/2011
(Continued)

OTHER PUBLICATIONS

Rami Melhem et al, RDIS: A Recursively Defined Invertible Set Scheme to Tolerate Multiple Stuck-At Faults in Resistive Memory. IEEE 2012. total 12 pages.
(Continued)

*Primary Examiner* — Stephen Elmore

(74) *Attorney, Agent, or Firm* — Huawei Technologies Co., Ltd.

(57) ABSTRACT

A write method and a write apparatus for a storage device, where the write method includes: acquiring n numerical values that need to be written; determining n bits corresponding to the n numerical values, and information about a stuck-at fault included in the n bits; grouping the n bits into B groups of bits, so that the B groups of bits meet a grouping condition; and correspondingly writing the n numerical values according to information about a stuck-at fault included in each group of bits in the B groups of bits and a numerical value that needs to be written and that is corresponding to the information about the stuck-at fault included in each group of bits in the B groups of bits.

14 Claims, 6 Drawing Sheets

(51) Int. Cl.
*G06F 11/10* (2006.01)
*G11C 13/00* (2006.01)
*G11C 11/419* (2006.01)
*G11C 16/10* (2006.01)
*G11C 29/44* (2006.01)

(52) U.S. Cl.
CPC ...... *G06F 11/1008* (2013.01); *G11C 13/0035* (2013.01); *G11C 29/08* (2013.01); *G11C 11/419* (2013.01); *G11C 16/10* (2013.01); *G11C 2029/4402* (2013.01)

(58) Field of Classification Search
USPC ............... 711/154, 156, 103; 365/185.33
See application file for complete search history.

(56) References Cited

U.S. PATENT DOCUMENTS

| | | | |
|---|---|---|---|
| 7,676,728 B2 * | 3/2010 | Resnick | G06F 11/106 711/105 |
| 8,612,828 B2 | 12/2013 | Brzezinski | |
| 9,235,465 B2 * | 1/2016 | Cho | G06F 11/10 |
| 2004/0199816 A1 | 10/2004 | Paredes et al. | |
| 2009/0138781 A1 | 5/2009 | Huang | |
| 2010/0095786 A1 | 4/2010 | Imholt | |
| 2011/0119456 A1 | 5/2011 | Ipek | |
| 2011/0154152 A1 | 6/2011 | Brzezinski | |
| 2011/0296258 A1 | 12/2011 | Schechter | |
| 2012/0198313 A1 | 8/2012 | Alam | |
| 2013/0013977 A1 | 1/2013 | Rivers | |
| 2013/0124942 A1 | 5/2013 | Franca-Neto et al. | |
| 2013/0132779 A1 * | 5/2013 | Smith | G06F 11/1076 714/42 |
| 2014/0101517 A1 | 4/2014 | Mateescu et al. | |
| 2014/0164873 A1 | 6/2014 | Guyot et al. | |

FOREIGN PATENT DOCUMENTS

| | | |
|---|---|---|
| KR | 20140076494 A | 6/2014 |
| RU | 2455712 C2 | 7/2012 |

OTHER PUBLICATIONS

Nak Hee Seongy et al, SAFER: Stuck-At-Fault Error Recovery for Memories, Microarchitecture (MICRO), 2010 43rd Annual IEEE/ACM International Symposium on. Dec. 4-8, 2010. total 10 pages.

Stuart Schechter et al. Use ECP, not ECC, for Hard Failures in Resistive Memories, ACM SIGARCH Computer Architecture News—ISCA'10. vol. 38 Issue 3, Jun. 2010. total 12 pages.

Jie Fan et al. Aegis: Partitioning Data Block for Efficient Recovery of Stuck-at-Faults in Phase Change Memory. 2013, total 12 pages.

* cited by examiner

WRITE METHOD AND WRITE APPARATUS FOR STORAGE DEVICE

CROSS-REFERENCE TO RELATED APPLICATIONS

This application is a continuation of International Application No. PCT/CN2014/091069, filed on Nov. 14, 2014, which claims priority to Chinese Patent Application No. 201310597968.2, filed on Nov. 22, 2013, both of which are hereby incorporated by reference in their entireties.

TECHNICAL FIELD

Embodiments of the present disclosure relate to the field of computer storage, and more specifically, to a write method and a write apparatus for a storage device.

BACKGROUND

In an impedance storage device, different impedance statuses of a medium are used to separately indicate information "0" and "1". However, most impedance storage devices have a write lifetime, and frequent write operations may cause occurrence of a stuck-at fault.

When a hardware error stuck-at fault occurs in an impedance storage device, a storage unit in which the error occurs keeps a fixed value "0" or "1", and the value of the unit cannot be further rewritten forever. In addition, a probability of stuck-at fault occurrence is much higher than that of a transient error, and the stuck-at fault becomes a major fault error in an impedance memory.

Although a multi-bit error correction mechanism based on Hamming code in an existing memory system can be used to correct this type of stuck-at fault, the multi-bit error correction mechanism based on the Hamming code is write-intensive, which may increase stuck-at fault occurrence in the system.

SUMMARY

Embodiments of the present disclosure provide a write method and a write apparatus for a storage device, which can solve a problem of a write error of a storage device in which a stuck-at fault occurs.

According to a first aspect, a write method for a storage device is provided, where the write method includes: acquiring n numerical values that need to be written; determining n bits in the storage device corresponding to the n numerical values that need to be written, and information about a stuck-at fault included in the n bits, where the information about the stuck-at fault includes a location of the stuck-at fault in the n bits and a numerical value of a bit in which the stuck-at fault is located; grouping the n bits into B groups of bits, so that the B groups of bits meet a grouping condition, and when the n bits represent a two-dimensional array of B rows and A columns, any two bits that belong to a same group in the n bits are in different rows and columns or any two bits that belong to a same group in the n bits are in a same row, where the grouping condition is used to limit a type or quantity of stuck-at faults included in each group of bits in the B groups of bits; and correspondingly writing, to the n bits according to the grouping manner and according to information about the stuck-at fault included in each group of bits in the B groups of bits and a numerical value that needs to be written and that is corresponding to a bit in which the stuck-at fault in each group of bits in the B groups of bits is located, the n numerical values that need to be written, where n, A, and B are positive integers, and $n \leq A \times B$.

With reference to the first aspect, in a first possible implementation manner, the grouping the n bits into B groups of bits, so that the B groups of bits meet a grouping condition includes: grouping the n bits into the B groups of bits, so that when the n bits represent the two-dimensional array of B rows and A columns, a location, of the $j^{th}$ bit in the $i^{th}$ group of bits in the B groups of bits, in the two-dimensional array of B rows and A columns meets: $p_{i,j+1} = p_{i,j} + 1$ and $q_{i,j+1} = (q_{i,j} + k) \mod B$; and adjusting a value of k, so that the B groups of bits meet the grouping condition, where $p_{i,j}$ is a column number, of the $j^{th}$ bit in the $i^{th}$ group of bits in the B groups of bits, in the two-dimensional array, $q_{i,j}$ is a row number, of the $j^{th}$ bit in the $i^{th}$ group of bits in the B groups of bits, in the two-dimensional array, i and $q_{i,j}$ are positive integers not greater than B, j and $p_{i,j}$ are positive integers not greater than A, k is a non-negative integer less than B, and the adjusting a value of k includes increasing the value of k by 1, where B is a minimum prime number not less than $\sqrt{n}$, and $$A = \lceil \frac{n}{B} \rceil.$$

With reference to the first aspect or the first possible implementation manner of the first aspect, in a second possible implementation manner, the grouping condition includes that: the quantity of stuck-at faults included in each group of bits in the B groups of bits does not exceed one.

With reference to the first aspect or the first possible implementation manner of the first aspect, in a third possible implementation manner, the grouping condition includes that: the type of the stuck-at faults included in each group of bits in the B groups of bits is the same, where the type of the stuck-at faults includes a stuck-at right fault and a stuck-at wrong fault; the stuck-at right fault refers to that a numerical value of a first bit in which the stuck-at fault is located is equal to a numerical value that needs to be written and that is corresponding to the first bit; and the stuck-at wrong fault refers to that a numerical value of a second bit in which the stuck-at fault is located is opposite to a numerical value that needs to be written and that is corresponding to the second bit.

With reference to the first aspect or any one of the foregoing possible implementation manners of the first aspect, in a fourth possible implementation manner, the correspondingly writing, to the n bits according to information about the stuck-at fault included in each group of bits in the B groups of bits and a numerical value that needs to be written and that is corresponding to a bit in which the stuck-at fault is located, the n numerical values that need to be written includes: determining, according to the information about the stuck-at fault included in each group of bits in the B groups of bits and the numerical value that needs to be written and that is corresponding to the bit in which the stuck-at fault is located, the type of the stuck-at fault included in each group of bits in the B groups of bits; and correspondingly writing, to the n bits according to the B groups of bits and the type of the stuck-at fault included in each group of bits in the B groups of bits, the n numerical values that need to be written.

With reference to the fourth possible implementation manner of the first aspect, in a fifth possible implementation manner, the correspondingly writing, to the n bits according to the B groups of bits and the type of the stuck-at fault included in each group of bits in the B groups of bits, the n numerical values that need to be written includes: when a type of a stuck-at fault included in the $i^{th}$ group of bits in the B groups of bits is a stuck-at wrong fault, correspondingly inverting a numerical value that needs to be written and that is corresponding to the $i^{th}$ group of bits, and writing a numerical value obtained after the inversion to the $i^{th}$ group of bits, where i is a positive integer not greater than B.

With reference to the fourth possible implementation manner of the first aspect, in a sixth possible implementation manner, the correspondingly writing, to the n bits according to the B groups of bits and the type of the stuck-at fault included in each group of bits in the B groups of bits, the n numerical values that need to be written includes: allocating a flag bit $m_i$ to the $i^{th}$ group of bits in the B groups of bits, where $m_i$ is used to indicate a type of a stuck-at fault included in the $i^{th}$ group of bits in the B groups of bits; and correspondingly writing, to the $i^{th}$ group of bits according to the flag bit $m_i$, a numerical value that needs to be written and that is corresponding to the $i^{th}$ group of bits, where i is a positive integer not greater than B.

With reference to the sixth possible implementation manner of the first aspect, in a seventh possible implementation manner, the correspondingly writing, to the $i^{th}$ group of bits according to the flag bit $m_i$, a numerical value that needs to be written and that is corresponding to the $i^{th}$ group of bits includes: when the flag bit $m_i=1$, inverting the numerical value that needs to be written and that is corresponding to the $i^{th}$ group of bits, and writing a numerical value obtained after the inversion to the $i^{th}$ group of bits, where the flag bit $m_i=1$ indicates that the type of the stuck-at fault included in the $i^{th}$ group of bits in the B groups of bits is a stuck-at wrong fault.

According to a second aspect, a write apparatus for a storage device is provided, where the write apparatus includes: an acquiring unit, configured to acquire n numerical values that need to be written; a first determining unit, configured to determine n bits corresponding to the n numerical values that need to be written, and information about a stuck-at fault included in the n bits, where the information about the stuck-at fault includes a location of the stuck-at fault in the n bits and a numerical value of a bit in which the stuck-at fault is located; a grouping unit, configured to group the n bits into B groups of bits, so that the B groups of bits meet a grouping condition, and when the n bits represent a two-dimensional array of B rows and A columns, any two bits that belong to a same group in the n bits are in different rows and columns or any two bits that belong to a same group in the n bits are in a same row, where the grouping condition is used to limit a type or quantity of stuck-at faults included in each group of bits in the B groups of bits; and a write unit, configured to correspondingly write, to the n bits according to the grouping manner and according to information about the stuck-at fault included in each group of bits in the B groups of bits and a numerical value that needs to be written and that is corresponding to a bit in which the stuck-at fault in each group of bits in the B groups of bits is located, the n numerical values that need to be written, where n, A, and B are positive integers, and n≤A×B.

With reference to the second aspect, in a first possible implementation manner, the grouping unit is specifically configured to:
group the n bits into the B groups of bits, so that when the n bits represent the two-dimensional array of B rows and A columns, a location, of the $j^{th}$ bit in the $i^{th}$ group of bits in the B groups of bits, in the two-dimensional array of B rows and A columns meets: $p_{i,j+1}=p_{i,j}+1$ and $q_{i,j+1}=(q_{i,j}+k) \mod B$; and adjust a value of k, so that the B groups of bits meet the grouping condition, where $p_{i,j}$ is a column number, of the $j^{th}$ bit in the $i^{th}$ group of bits in the B groups of bits, in the two-dimensional array, $q_{i,j}$ is a row number, of the $j^{th}$ bit in the $i^{th}$ group of bits in the B groups of bits, in the two-dimensional array, i and $q_{i,j}$ are positive integers not greater than B, j and $p_{i,j}$ are positive integers not greater than A, k is a non-negative integer less than B, and the adjusting a value of k includes increasing the value of k by 1, where B is a minimum prime number not less than √n, and $$A = \lceil \frac{n}{B} \rceil.$$

With reference to the second aspect or the first possible implementation manner of the second aspect, in a second possible implementation manner, the grouping condition is that: the quantity of stuck-at faults included in each group of bits in the B groups of bits does not exceed one.

With reference to the second aspect or the first possible implementation manner of the second aspect, in a third possible implementation manner, the grouping condition is that: the type of the stuck-at faults included in each group of bits in the B groups of bits is the same, where the type of the stuck-at faults includes a stuck-at right fault and a stuck-at wrong fault; the stuck-at right fault refers to that a numerical value of a first bit in which the stuck-at fault is located is equal to a numerical value that needs to be written and that is corresponding to the first bit; and the stuck-at wrong fault refers to that a numerical value of a second bit in which the stuck-at fault is located is opposite to a numerical value that needs to be written and that is corresponding to the second bit.

With reference to the second aspect or any one of the foregoing possible implementation manners of the second aspect, in a fourth possible implementation manner, the write unit includes: a second determining unit, configured to determine, according to the information about the stuck-at fault included in each group of bits in the B groups of bits and the numerical value that needs to be written and that is corresponding to the bit in which the stuck-at fault is located, the type of the stuck-at fault included in each group of bits in the B groups of bits; and a first write unit, configured to correspondingly write, to the n bits according to the B groups of bits and the type of the stuck-at fault included in each group of bits in the B groups of bits, the n numerical values that need to be written.

With reference to the fourth possible implementation manner of the second aspect, in a fifth possible implementation manner, the first write unit is specifically configured to: when a type of a stuck-at fault included in the $i^{th}$ group of bits in the B groups of bits is a stuck-at wrong fault, correspondingly invert a numerical value that needs to be written and that is corresponding to the $i^{th}$ group of bits, and write a numerical value obtained after the inversion to the $i^{th}$ group of bits, where i is a positive integer not greater than B.

With reference to the fourth possible implementation manner of the second aspect, in a sixth possible implementation manner, the write unit further includes an allocation unit, where the allocation unit is configured to allocate a flag bit $m_i$ to the $i^{th}$ group of bits in the B groups of bits, where $m_i$ is used to indicate a type of a stuck-at fault included in the $i^{th}$ group of bits in the B groups of bits; and the first write unit is specifically configured to correspondingly write, to the $i^{th}$ group of bits according to the flag bit $m_i$, a numerical value that needs to be written and that is corresponding to the $i^{th}$ group of bits, where i is a positive integer not greater than B.

With reference to the sixth possible implementation manner of the second aspect, in a seventh possible implementation manner, the first write unit is specifically configured to: when the flag bit $m_i=1$, invert the numerical value that needs to be written and that is corresponding to the $i^{th}$ group of bits, and write a numerical value obtained after the inversion to the $i^{th}$ group of bits, where the flag bit $m_i=1$ indicates that the type of the stuck-at fault included in the $i^{th}$ group of bits in the B groups of bits is a stuck-at wrong fault.

In the embodiments of the present disclosure, it is determined, by adjusting an interval between two adjacent bits in a same group, that n bits are grouped into B groups, and numerical values that need to be written can be correspondingly written to the n bits according to information about a stuck-at fault in each group of the B groups, so that a write error caused by a stuck-at fault in an impedance storage device can be effectively avoided.

BRIEF DESCRIPTION OF DRAWINGS

To describe the technical solutions in the embodiments of the present disclosure more clearly, the following briefly introduces the accompanying drawings may be needed for describing the embodiments.

DESCRIPTION OF EMBODIMENTS

The following clearly describes the technical solutions in the embodiments of the present disclosure with reference to the accompanying drawings in the embodiments of the present disclosure.

Figure 1:
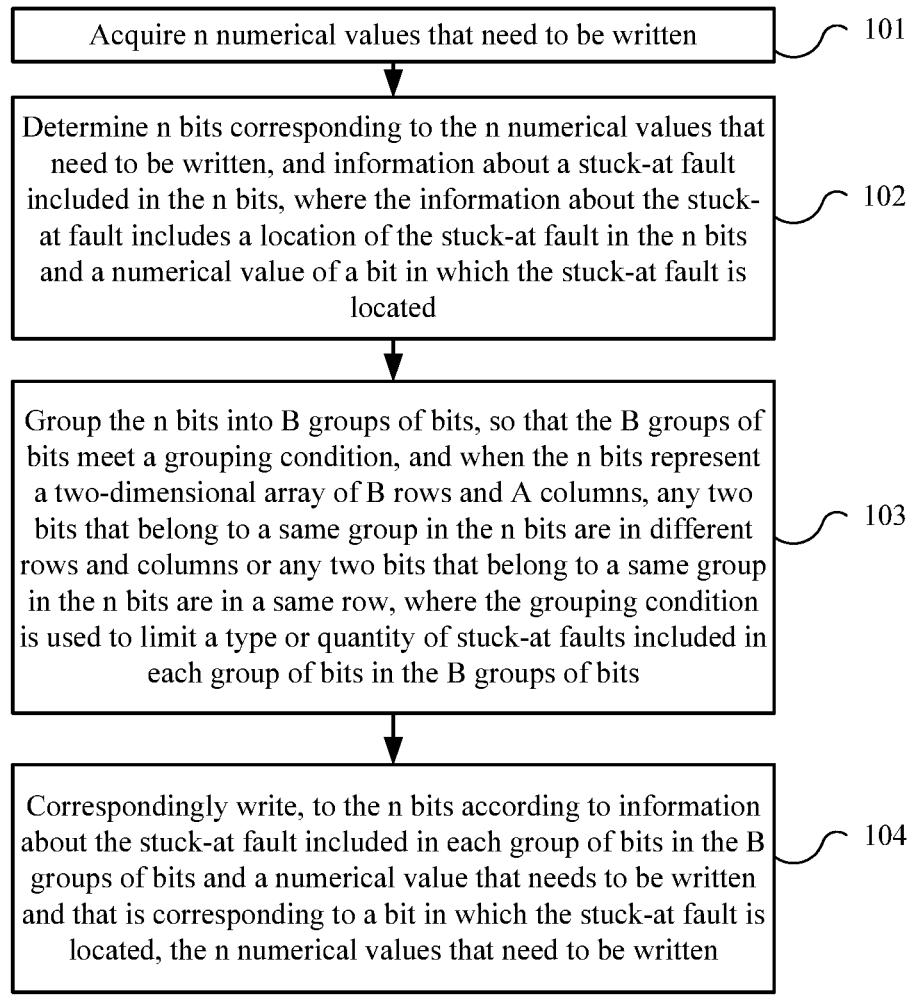
FIG. 1 is a flowchart of a write method for a storage device according to an embodiment of the present disclosure.

FIG. 1 is a flowchart of a write method for a storage device according to an embodiment of the present disclosure. The write method shown in FIG. 1 includes:

101. Acquire n numerical values that need to be written.

102. Determine n bits corresponding to the n numerical values that need to be written, and information about a stuck-at fault included in the n bits, where the information about the stuck-at fault includes a location of the stuck-at fault in the n bits and a numerical value of a bit in which the stuck-at fault is located.

103. Group the n bits into B groups of bits, so that the B groups of bits meet a grouping condition, and when the n bits represent a two-dimensional array of B rows and A columns, any two bits that belong to a same group in the n bits are in different rows and columns or any two bits that belong to a same group in the n bits are in a same row, where the grouping condition is used to limit a type or quantity of stuck-at faults included in each group of bits in the B groups of bits.

104. Correspondingly write, to the n bits according to information about the stuck-at fault included in each group of bits in the B groups of bits and a numerical value that needs to be written and that is corresponding to a bit in which the stuck-at fault is located, the n numerical values that need to be written, where n, A, and B are positive integers, and $n \leq A \times B$.

In this embodiment of the present disclosure, it is determined, by adjusting an interval between two adjacent bits in a same group, that n bits are grouped into B groups, and numerical values that need to be written can be correspondingly written to the n bits according to information about a stuck-at fault in each group of the B groups, so that a write error caused by a stuck-at fault in an impedance storage device can be effectively prevented.

In step 102, the n bits are locations to which the n numerical values in step 101 need to be correspondingly written. In addition, when the n bits are determined, the information about the stuck-at fault included in the n bits may also be determined. The information about the stuck-at fault may include a quantity of stuck-at faults included in the n bits, the location of the stuck-at fault in the n bits, and the numerical value of the bit in which the stuck-at fault is located.

For ease of understanding, the n bits determined in step 102 may be numbered 1 to n, which may also be understood as location numbers of the n bits.

In step 103, first, initial grouping is performed on the n bits. The initial grouping may be: each A bits in the n bits are successively grouped as one group, so that the n bits are grouped into the B groups of bits during the initial grouping, where each of the first B−1 groups of bits in the B groups of bits includes A bits, and the $B^{th}$ group of bits, that is, the last group of bits, includes n−A×(B−1) bits.

Optionally, in step 103, it may be understood that the n bits are grouped into the B groups of bits, so that when the n bits represent the two-dimensional array of B rows and A columns, a location, of the $j^{th}$ bit in the $i^{th}$ group of bits in the B groups of bits, in the two-dimensional array of B rows and A columns should meet: $p_{i,j+1}=p_{i,j}+1$ and $q_{i,j+1}=(q_{i,j}+k) \bmod B$. In addition, a value of k may be adjusted, so that the B groups of bits meet the grouping condition, where $p_{i,j}$ is a column number, of the $j^{th}$ bit in the $i^{th}$ group of bits in the B groups of bits, in the two-dimensional array, $q_{i,j}$ is a row number, of the $j^{th}$ bit in the $i^{th}$ group of bits in the B groups of bits, in the two-dimensional array, i and $q_{i,j}$ are positive integers not greater than B, j and $p_{i,j}$ are positive integers not greater than A, k is a non-negative integer less than B, and the adjusting the value of k includes increasing the value of k by 1, where B is a minimum prime number not less than $\sqrt{n}$, and $$A = \left\lceil \frac{n}{B} \right\rceil.$$

Furthermore, the n bits may be mutually corresponding to the two-dimensional array according to the initial grouping. For example, one row in the two-dimensional array may be corresponding to one group in the initial grouping, that is, k=0. Alternatively, if it is assumed that a location number of a bit in the n bits is x, and a corresponding row and column of the bit in the two-dimensional array are a and b, x=(b−1)×A+a should be met.

It should be noted that k corresponding to initial groups may also be another integer less than B, such as 1, 2, or B−1, which is not limited in the present disclosure.

Optionally, in step 103, it may also be understood that the n bits are grouped into the B groups of bits, so that a difference between location numbers, in the n bits, of two adjacent bits in each of the B groups of bits is k×A+1, or, that is, bits at intervals of k×A+1 in the n bits belong to a same group. Furthermore, if n=A×B, it may be considered that a next bit of the $n^{th}$ bit in the n bits is the first bit of the n bits, or it may be considered that the n bits are linked head-to-tail circularly and are grouped at intervals. If n<A×B, it may be considered that the $(n+1)^{th}$ bit to the $(A×B)^{th}$ bit are empty, a next bit of the $n^{th}$ bit in the n bits is the empty $(n+1)^{th}$ bit, it a next bit of the $(A×B)^{th}$ bit is the first bit in the n bits, or it may be considered that A×B bits are linked head-to-tail circularly and are grouped at intervals.

Optionally, in step 103, it may also be understood that the n bits are grouped into the B groups of bits, so that when the n bits are corresponding to n data points in a two-dimensional Cartesian coordinate system, two data points corresponding to any two bits that belong to a same group have a same vertical coordinate in the two-dimensional Cartesian coordinate system, or two data points corresponding to any two bits that belong to a same group have different horizontal coordinates and vertical coordinates in the two-dimensional Cartesian coordinate system. In addition, multiple straight lines with a same slope may be made, and all data points in a same straight line belong to a same group. In addition, the slope of the multiple straight lines is k.

Furthermore, for a correspondence between the n bits and the n data points in the two-dimensional Cartesian coordinate system, refer to a correspondence between the foregoing n bits and points in the two-dimensional array. For example, data points that have a same vertical coordinate and in the n data points in the two-dimensional Cartesian coordinate system may be corresponding to one group in the initial groups of the n bits, that is, the slope k=0. Optionally, k corresponding to the initial group may also be another integer of B−1 values, which is not limited in the embodiment of the present disclosure.

It should be noted that the foregoing descriptions are grouping analyses performed only from different mathematics angles, where a common parameter is k. The parameter k may be understood that a location interval, in the n bits, between two adjacent bits in a same group is k×A+1. The parameter k may also be understood as a difference between rows in which two adjacent bits in a same group are located in a two-dimensional array. The parameter k may also be understood as a slope of a line in which bits in a same group are located in a two-dimensional Cartesian coordinate system. During further grouping adjustment, a new group may be determined by adjusting the value of k. Herein, the adjusting the value of k may be increasing the value of k by 1, for example, increasing from 0 to 1 or increasing from 1 to 2. A value range of k includes B integers from 0 to B−1.

A person skilled in the art can understand that a manner that can be represented as determining groups using a value change of the parameter k still falls within the scope of this embodiment of the present disclosure even if another mathematics means or method is used to perform analysis.

Optionally, as an embodiment, the grouping condition described in step 103 may be a first grouping condition: A quantity of stuck-at faults included in each group of bits in the B groups of bits does not exceed one.

Optionally, as another embodiment, the grouping condition described in step 103 may be a second grouping condition: A type of the stuck-at fault included in each group of bits in the B groups of bits is the same, where the type of the stuck-at fault includes a stuck-at right fault and a stuck-at wrong fault; the stuck-at right fault refers to that a numerical value of a first bit in which the stuck-at fault is located is equal to a numerical value that needs to be written and that is corresponding to the first bit; and the stuck-at wrong fault refers to that a numerical value of a second bit in which the stuck-at fault is located is opposite to a numerical value that needs to be written and that is corresponding to the second bit.

In a grouping manner meeting the first grouping condition, a quantity of stuck-at faults included in a same group is zero or one. In a grouping manner meeting the second grouping condition, a quantity of stuck-at faults included in a same group may be zero, or may be one or more.

Optionally, as an embodiment, in step 104, according to the information about the stuck-at fault included in each group of bits in the B groups of bits and the numerical value that needs to be written and that is corresponding to the bit in which the stuck-at fault is located, a type of the stuck-at fault included in each group of bits in the B groups of bits is determined. Then, according to the B groups of bits and the type of the stuck-at fault included in each group of bits in the B groups of bits, the n numerical values that need to be written are correspondingly written to the n bits.

Furthermore, when a type of a stuck-at fault included in the $i^{th}$ group of bits in the B groups of bits is a stuck-at wrong fault, a numerical value that needs to be written and that is corresponding to the $i^{th}$ group of bits may be inverted and then written to the $i^{th}$ group of bits, where i is a positive integer not greater than B.

Furthermore, as another embodiment, a corresponding flag bit $m_i$ may be allocated to the $i^{th}$ group of bits in the B groups of bits, where $m_i$ is used to indicate a type of a stuck-at fault included in the $i^{th}$ group of bits; further, according to the flag bit $m_i$, a numerical value that needs to be written and that is corresponding to the $i^{th}$ group of bits is correspondingly written to the $i^{th}$ group of bits, where i is a positive integer not greater than B.

For example, $m_i=1$ may be used to indicate that the type of the stuck-at fault included in the $i^{th}$ group of bits in the B groups of bits is a stuck-at wrong fault. In addition, when $m_i=1$, the numerical value that needs to be written and that is corresponding to the $i^{th}$ group of bits is correspondingly inverted and then written to the $i^{th}$ group of bits.

For example, a vector m having B components may be allocated to the B groups of bits, where the $i^{th}$ component of the vector is corresponding to the flag bit $m_i$ of the $i^{th}$ group of bits in the B groups of bits. In addition, an initial value of each component in the vector m may be set to 0. When it may be determined that a stuck-at fault included in a group is a stuck-at wrong fault, a flag bit corresponding to the group is set to 1. During writing, for the group whose flag bit is 1, a numerical value that needs to be written and that is corresponding to the group is correspondingly inverted and then written.

It should be noted that a specific write manner is not limited in this embodiment of the present disclosure. Optionally, writing may be performed according to the determined groups. For example, a numerical value that needs to be written and that is corresponding to the first group of bits in the determined groups may be first written, then a numerical value that needs to be written and that is corresponding to the second group of bits in the determined groups is written, and so on, until writing of the n numerical values of the B groups of bits is complete. Alternatively, writing may be performed according to location numbers of the n bits in sequence or inverse sequence. For example, first, a group in which the first bit in the n bits is located may be determined, and writing is performed according to a flag bit corresponding to the group in which the first bit is located; then, a group in which the second bit in the n bits is located is determined, and writing is performed according to a flag bit corresponding to the group in which the second bit is located, and so on, until writing of the n numerical values is complete. A person skilled in the art can understand that completing writing in another manner still falls within the scope of this embodiment of the present disclosure.

In this embodiment of the present disclosure, a quantity of determined groups is fixed and unchanged, that is, the quantity of groups remains B for n bits. In addition, a value of k is B integers from 0 to B−1, and the maximum quantity of times of adjusting k to determine groups is B times. In this way, grouping efficiency can be ensured. In addition, this grouping manner is relatively simple during implementation.

In this embodiment of the present disclosure, determining of a grouping condition needs to be performed during each writing. For example, during the first writing, k corresponding to determined groups is equal to k1; during the second writing, grouping condition determining is performed, and k corresponding to initial groups is equal to k1, grouping adjustment may be performed based on k=k1, and corresponding k that meets the grouping condition during the second writing is determined.

Figure 2:
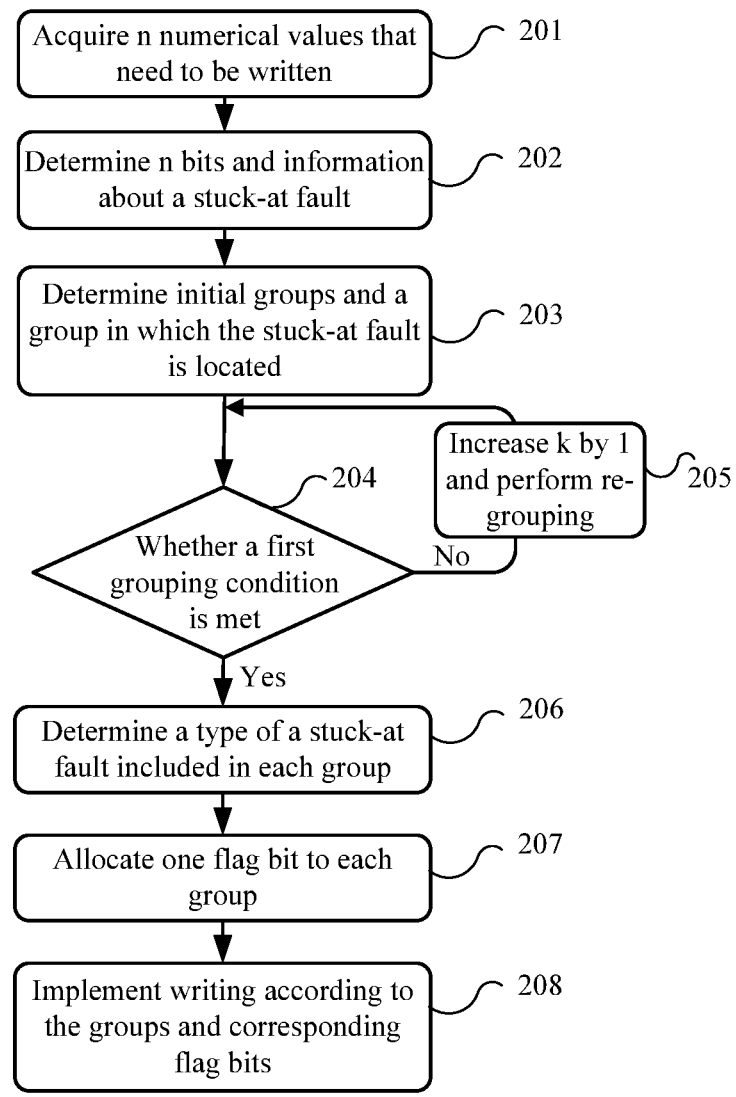
FIG. 2 is a flowchart of a write method for a storage device according to another embodiment of the present disclosure.

FIG. 2 is a flowchart of a write method for a storage device according to another embodiment of the present disclosure. The write method shown in FIG. 2 includes:

201. Acquire n numerical values that need to be written.

202. Determine n bits corresponding to the n numerical values that need to be written, and information about a stuck-at fault included in the n bits, where the information about the stuck-at fault includes a location of the stuck-at fault in the n bits and a numerical value of a bit in which the stuck-at fault is located.

203. Determine initial groups and a group in which the stuck-at fault is located.

Furthermore, the n bits may be initially grouped into B groups of bits, each group of bits in the first B−1 groups of bits includes A bits, and the $B^{th}$ group of bits includes n−A×(B−1) bits. For example, in the n bits, the first bit to the $A^{th}$ bit are grouped into the first group, the $(A+1)^{th}$ bit to the $2A^{th}$ bit are grouped into the second group, and so on.

This grouping manner is corresponding to k=0. Descriptions related to k are the same as those described above; to prevent repetition, details are not described herein again.

It should be noted that k corresponding to the initial groups may also be another integer of B−1, which is not limited in the embodiment of the present disclosure.

204. Determine whether the groups meet a first grouping condition; when the groups do not meet the first grouping condition, perform step 205, and when the groups meet the first grouping condition, perform step 206.

It should be noted that if it is found during the determining in step 202 that a quantity of stuck-at faults occurring in the n bits is greater than B, the first grouping condition cannot be met by performing grouping in this manner. Alternatively, on the other hand, when it is found during the determining in step 204 that the first grouping condition is not met, step 205 is performed. When k increases from 0 to B−1, the groups do not meet the first grouping condition when k is any one of the B values.

205. Increase a value of k by 1 and perform grouping again.

When the value of k increases by 1, a grouping manner is determined again and is the same as that described above; to prevent repetition, details are not described herein again.

206. Determine a type of a stuck-at fault included in each group of the groups.

Furthermore, a numerical value of a bit in which a stuck-at fault is located and a numerical value that needs to be written and that is corresponding to the bit are compared, so as to determine a type of the stuck-at fault. When the numerical value of the bit is the same as the numerical value that needs to be written and that is corresponding to the bit, the type of the stuck-at fault is a stuck-at right fault. When the numerical value of the bit is opposite to the numerical value that needs to be written and that is corresponding to the bit, the type of the stuck-at fault is a stuck-at wrong fault.

207. Allocate one flag bit to each group according to the type determined in step 206.

Furthermore, if a type of a stuck-at fault is a stuck-at wrong fault, a flag bit 1 may be allocated to a group in which the stuck-at fault is located, and a flag bit 0 is allocated to a group not including the stuck-at fault and a group in which a stuck-at fault with a type being a stuck-at right fault is located.

208. Write the n numerical values according to the determined groups and corresponding flag bits.

Furthermore, a numerical value of a group whose flag bit is 1 is correspondingly inverted and then written; a group whose flag bit is 0 is correspondingly written normally.

In this embodiment of the present disclosure, it is determined, by adjusting an interval between two adjacent bits in a same group, that n bits are grouped into B groups, and numerical values that need to be written can be correspondingly written to the n bits according to information about a stuck-at fault in each group of the B groups, so that a write error caused by a stuck-at fault in an impedance storage device can be effectively prevented.

Figure 3:
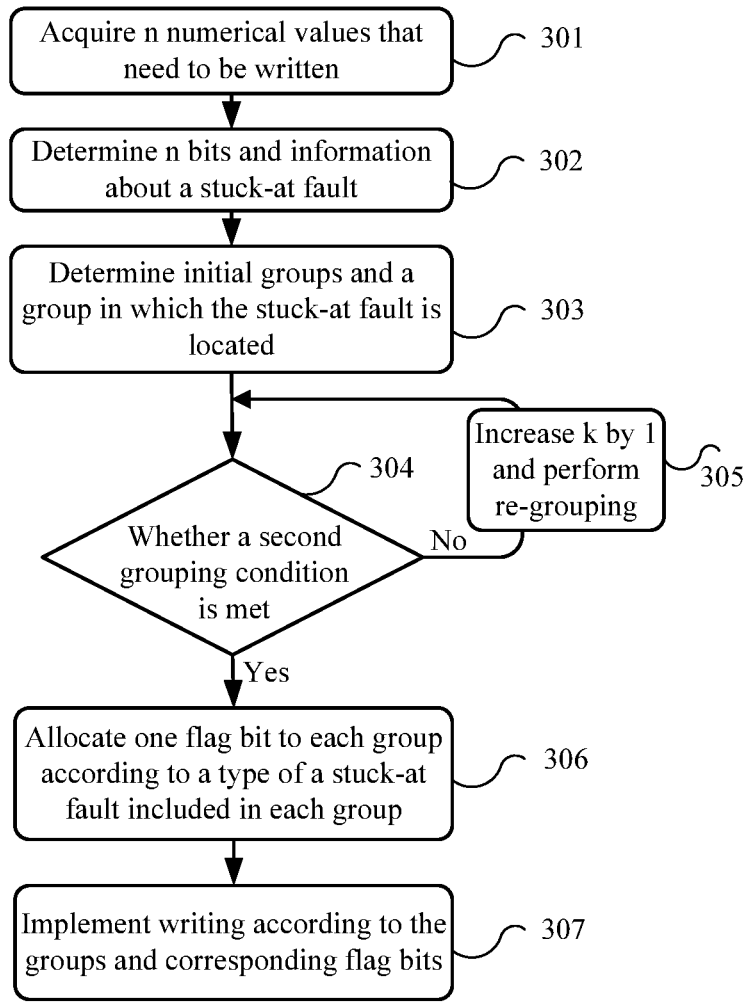
FIG. 3 is a flowchart of a write method for a storage device according to another embodiment of the present disclosure.

FIG. 3 is a flowchart of a write method for a storage device according to another embodiment of the present disclosure. The write method shown in FIG. 3 includes:

301. Acquire n numerical values that need to be written.

302. Determine n bits corresponding to the n numerical values that need to be written, and information about a stuck-at fault included in the n bits, where the information about the stuck-at fault includes a location of the stuck-at fault in the n bits, a numerical value of a bit in which the stuck-at fault is located, and a type of the stuck-at fault.

Furthermore, a numerical value of a bit in which a stuck-at fault is located and a numerical value that needs to be written and that is corresponding to the bit are compared, so as to determine a type of the stuck-at fault. When the numerical value of the bit is the same as the numerical value that needs to be written and that is corresponding to the bit, the type of the stuck-at fault is a stuck-at right fault. When the numerical value of the bit is opposite to the numerical value that needs to be written and that is corresponding to the bit, the type of the stuck-at fault is a stuck-at wrong fault.

303. Determine initial groups and a group in which the stuck-at fault is located.

Furthermore, the n bits may be initially grouped into B groups of bits, each group of bits in the first B−1 groups of bits includes A bits, and the $B^{th}$ group of bits includes n−A×(B−1) bits. For example, in the n bits, the first bit to the $A^{th}$ bit are grouped into the first group, the $(A+1)^{th}$ bit to the $2A^{th}$ bit are grouped into the second group, and so on.

This grouping manner is corresponding to k=0. Descriptions related to k are the same as those described above; to prevent repetition, details are not described herein again.

It should be noted that k corresponding to the initial groups may also be another integer of B−1, which is not limited in the embodiment of the present disclosure.

304. Determine whether the groups meet a second grouping condition; when the groups do not meet the second grouping condition, perform step 305, and when the groups meet the second grouping condition, perform step 306.

305. Increase a value of k by 1 and perform grouping again.

306. Allocate one flag bit to each group according to a type of a stuck-at fault included in each group of the determined groups.

307. Write the n numerical values according to the determined groups and corresponding flag bits.

In this embodiment of the present disclosure, it is determined, by adjusting an interval between two adjacent bits in a same group, that n bits are grouped into B groups, and numerical values that need to be written can be correspondingly written to the n bits according to information about a stuck-at fault in each group of the B groups, so that a write error caused by a stuck-at fault in an impedance storage device can be effectively prevented.

Figure 4:
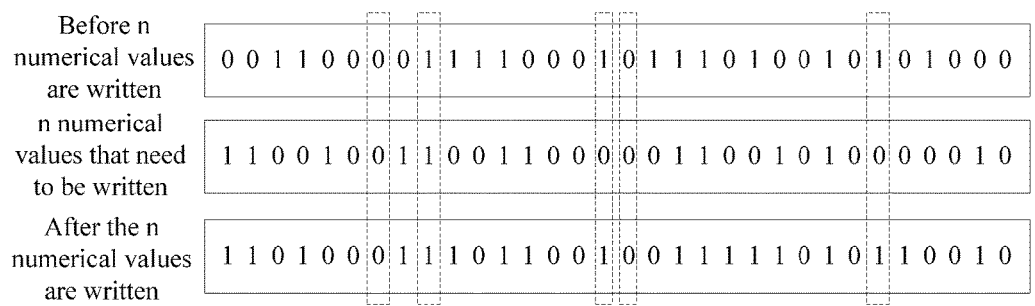
FIG. 4 is a schematic diagram of a specific example of a write method for a storage device according to another embodiment of the present disclosure.

FIG. 4 is a schematic diagram of a specific example of a write method for a storage device according to another embodiment of the present disclosure. In the method shown in FIG. 4, n=32 is used as a specific example to describe this embodiment of the present disclosure.

Each row shown in FIG. 4 is numerical values in 32 bits. A dashed line in FIG. 4 indicates a location in which a stuck-at fault occurs.

It should be noted that n=32 is used as an example for description in the embodiment in FIG. 4. However, a person skilled in the art can understand that n may be another positive integer, and such a change still falls within the scope of this embodiment of the present disclosure.

It is assumed that a data block includes n=32 bits. Numerical values of the 32 bits, that is, n numerical values before writing is performed are shown in the first row in FIG. 4. Locations in which the 32 bits are located are numbered 1 to 32, and location numbers in which the 32 bits are located and corresponding numerical values are shown in Table 1. Location numbers, in which a stuck-at fault occurs, in the 32 bits are 7, 9, 16, 17, and 27.

TABLE 1

| | Location number | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Numerical value | 0 | 0 | 1 | 1 | 0 | 0 | 0 | 0 | 1 | 1 | 1 | 1 | 0 | 0 | 0 | 1 |
| | Location number | | | | | | | | | | | | | | | |
| | 17 | 18 | 19 | 20 | 21 | 22 | 23 | 24 | 25 | 26 | 27 | 28 | 29 | 30 | 31 | 32 |
| Numerical value | 0 | 1 | 1 | 1 | 0 | 1 | 0 | 0 | 1 | 0 | 1 | 0 | 1 | 0 | 0 | 0 |

It should be noted that in this embodiment of the present disclosure, a location number refers to a sequence number generated by numbering n bits of a data block.

Numerical values that need to be written and are corresponding to the 32 bits, that is, n numerical values that need to be written, are shown in the second row in FIG. 4; 32 numerical values that need to be written and are corresponding to the 32 location numbers are shown in Table 2.

TABLE 2

| | Location number | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Numerical values that need to be written | 1 | 1 | 0 | 0 | 1 | 0 | 0 | 1 | 1 | 0 | 0 | 1 | 1 | 0 | 0 | 0 |
| | Location number | | | | | | | | | | | | | | | |
| | 17 | 18 | 19 | 20 | 21 | 22 | 23 | 24 | 25 | 26 | 27 | 28 | 29 | 30 | 31 | 32 |
| Numerical values that need to be written | 0 | 0 | 1 | 1 | 0 | 0 | 1 | 0 | 1 | 0 | 0 | 0 | 0 | 0 | 1 | 0 |

B is given as a minimum prime number greater than or equal to $\sqrt{n}=\sqrt{32}$, that is, B=7; given $$A = \left\lceil \frac{n}{B} \right\rceil = \left\lceil \frac{32}{7} \right\rceil,$$

that is, A=5.

The n=32 bits shown in Table 1 are represented as a two-dimensional array of B=7 rows and A=5 columns, as shown in Table 3. For ease of description, the two-dimensional array shown in Table 3 includes location numbers corresponding to the numerical values shown in Table 1. In addition, one row of this two-dimensional array represents one group, that is, any two bits that belong to a same group are in a same row. For ease of description, location numbers 33, 34, and 35 are hypothetically supplemented in Table 3 in this embodiment of the present disclosure. Correspondingly, it is hypothesized that bits whose location numbers are 33, 34, and 35 are empty.

TABLE 3

| 31 | 32 | 33 | 34 | 35 |
|---|---|---|---|---|
| 26 | 27 | 28 | 29 | 30 |
| 21 | 22 | 23 | 24 | 25 |
| 16 | 17 | 18 | 19 | 20 |
| 11 | 12 | 13 | 14 | 15 |
| 6 | 7 | 8 | 9 | 10 |
| 1 | 2 | 3 | 4 | 5 |

In Table 3, if it is assumed that in the two-dimensional array, a row number and a column number of location number x are a and b, location number distribution in Table 3 meets: x=(b−1)×A+a.

It should be noted that Table 3 is only exemplary description and is not the only representation that represents the 32 location numbers as a two-dimensional array of 7 rows and 5 columns. For example, the 32 location numbers may also be arranged vertically, that is, x=(b−1)×B+a is met, which is not limited in the embodiment of the present disclosure.

The 32 bits are grouped into B=7 groups, and each row of the two-dimensional array shown in Table 3 is correspondingly considered as one group, that is, a quantity of rows of the two-dimensional array is considered as a quantity of groups. Location numbers corresponding to the first group are 1, 2, 3, 4, and 5; location numbers corresponding to the second group are 6, 7, 8, 9, and 10; location numbers corresponding to the third group are 11, 12, 13, 14, and 15; location numbers corresponding to the fourth group are 16, 17, 18, 19, and 20; location numbers corresponding to the fifth group are 21, 22, 23, 24, and 25; location numbers corresponding to the sixth group are 26, 27, 28, 29, and 30; location numbers corresponding to the seventh group are 31 and 32.

It should be noted that the n=32 bits are grouped into seven groups, and a quantity of bits included in each group does not exceed A=5. If three hypothesized location numbers 33, 34, and 35 are included, it may be considered that each group includes five location numbers in the foregoing grouping manner.

In this way, the 32 location numbers are grouped into seven groups. From the first angle, this grouping manner may be understood as follows: A location ($q_{i,j}$, $p_{i,j}$), in the two-dimensional array, of the $j^{th}$ location number of the $i^{th}$ group in the seven groups meets:

$$p_{i,j+1}=p_{i,j}+1, q_{i,j+1}=(q_{i,j}+k) \bmod B \quad (1)$$

where, k=0, and B=7; $q_{i,j}$ is a row number, in the two-dimensional array, of the $j^{th}$ location number of the $i^{th}$ group in the seven groups, and $p_{i,j}$ is a column number, in the two-dimensional array, of the $j^{th}$ location number of the $i^{th}$ group in the seven groups.

It should be noted that in this embodiment of the present disclosure, a location in the two-dimensional array refers to location information of a row and a column in the two-dimensional array.

For example, the fourth group in the foregoing groups is used as an example, that is, i=4, and a correspondence between a location number in the fourth group and a location ($q_{i,j}$, $p_{i,j}$) in the two-dimensional array, of the location number in the fourth group is shown in Table 4. It may be found that a correspondence between ($q_{i,j}$, $p_{i,j}$), i, and j meets the foregoing formula (1).

TABLE 4

| i | j | ($q_{i,j}$, $p_{i,j}$) |
|---|---|---|
| i = 4 | j = 1 | (4, 1) |
|  | j = 2 | (4, 2) |
|  | j = 3 | (4, 3) |
|  | j = 4 | (4, 4) |
|  | j = 5 | (4, 5) |

From the second angle, it may also be understood that this grouping manner is as follows: A difference between two adjacent location numbers in each group is 1. That is, an interval between two adjacent location numbers in each group is 1. In addition, this interval may be corresponding to k×A+1 from the first angle.

From the third angle, it may also be understood that this grouping manner is as follows: When n bits are corresponding to n data points in a two-dimensional Cartesian coordinate system, two data points corresponding to any two bits that belong to a same group have a same vertical coordinate in the two-dimensional Cartesian coordinate system. Thirty-two data points corresponding to the 32 bits are located in seven straight lines in the two-dimensional Cartesian coordinate system, and data points in each straight line are located in a same group. In addition, a slope of these seven straight lines is 0. In addition, the slope of the straight lines may be corresponding to k from the first angle.

It should be noted that the foregoing first angle to the third angle are merely different mathematics understandings of the current grouping. A person skilled in the art can understand that analysis performed on this grouping manner using another mathematics means or method still falls within the scope of this embodiment of the present disclosure.

For the grouping manner shown in Table 3, first, it is needed to determine whether the grouping meets a grouping condition.

Optionally, as an embodiment, the grouping condition may be a first grouping condition: A quantity of stuck-at faults included in each group does not exceed one. The location numbers, in which a stuck-at fault occurs, in the 32 bits shown in Table 1 are 7, 9, 16, 17, and 27. It may be found by referring to Table 3 that the location numbers 7 and 9 in which the stuck-at fault occurs are in the second group, and the location numbers 16 and 17 in which the stuck-at fault occurs are in the fourth group. That is, in the foregoing groups, both a quantity of stuck-at faults included in the second group and a quantity of stuck-at faults included in the fourth group exceed one, so that the first grouping condition is not met. In this case, the foregoing grouping manner needs to be adjusted, so as to re-group the 32 bits.

Corresponding to the foregoing first angle, a re-grouping manner may be increasing k by 1. That is, k=0 before the re-grouping, and k=1 during the re-grouping. In this way, a new grouping manner is as follows: Location numbers corresponding to the first group are 1, 7, 13, 19, and 25; location numbers corresponding to the second group are 6, 12, 18, 24, and 30; location numbers corresponding to the third group are 11, 17, 23, 29, and ○; location numbers corresponding to the fourth group are 16, 22, 28, □, and 5; location numbers corresponding to the fifth group are 21, 27, ◎, 4, and 10; location numbers corresponding to the sixth group are 26, 32, 3, 9, and 15; location numbers corresponding to the seventh group are 31, 2, 8, 14, and 20, where ◎, □, and ○ indicate that the locations are empty and successively represent the hypothesized location numbers 33, 34, and 35 in Table 3.

Referring to Table 3, it may be seen that in such a new grouping manner, any two bits that belong to a same group are in different rows and columns. In addition, corresponding to the foregoing first angle, in this new grouping manner, the location ($q_{i,j}$, $p_{i,j}$), in the two-dimensional array, of the $j^{th}$ location number of the $i^{th}$ group in the seven groups still meets the foregoing formula (1), and k=1. To prevent repetition, details are not described herein again.

Corresponding to the foregoing second angle, it may also be understood that this new grouping manner is as follows: A difference between two adjacent location numbers in each group is 6. That is, an interval between two adjacent location numbers in each group is 6. In addition, this interval may be corresponding to k×A+1 from the first angle. Analysis is performed using the fourth group in the new groups as an example. An interval between two of the first three location numbers 16, 22, and 28 in the fourth group is 6, the fourth location number □ represents the hypothesized location number 34, an interval between 34 and 28 is 6; the fifth location number 5 may be understood as that: a next location number of 35 is 1, that is, it may be hypothesized that location numbers from 1 to 35 are arranged as a ring linked head-to-tail, so that a next location number with an interval of 6 from 34 is 5. In addition, a quantity of location numbers included in each group is 5, the five location numbers include the hypothesized location numbers, and the fifth location number in the fourth group has been determined as the location number 5. Therefore, the fourth group in this grouping manner can be determined. Location numbers in several other groups corresponding to the foregoing second angle may also be similarly understood; to prevent repetition, details are not described herein again.

Corresponding to the foregoing third angle, it may also be understood that this new grouping manner is as follows: When 32 bits are corresponding to 32 data points in the two-dimensional Cartesian coordinate system, two data points corresponding to any two bits that belong to a same group have different horizontal coordinates and vertical coordinates in the two-dimensional Cartesian coordinate system. In addition, multiple straight lines with a same slope may be made, and all data points in a same straight line belong to a same group. In addition, the slope of the multiple straight lines may be corresponding to k=1 from the first angle.

Further, it is needed to determine whether the new groups meet the first grouping condition. The location numbers, in which a stuck-at fault occurs, in the 32 bits shown in Table 1 are 7, 9, 16, 17, and 27. With reference to the new grouping manner, it may be found that the location numbers in which the stuck-at fault occurs are 7, 9, 16, 17, and 27 that are respectively located in the first group, the sixth group, the fourth group, the third group, and the fifth group in the new groups. That is, the new grouping manner meets the first grouping condition: A quantity of stuck-at faults included in each group does not exceed one. Therefore, it may be determined that seven groups meeting the grouping condition are the new groups.

It should be noted that if it is assumed that the new groups still do not meet the first grouping condition, k may be continuously increased by 1, so as to obtain another new grouping manner, and it is further determined whether the another new grouping manner meets the first grouping condition.

Optionally, as another embodiment, the grouping condition may be a second grouping condition: A type of a stuck-at fault included in each group is the same, where the type of the stuck-at fault includes a stuck-at right fault or a stuck-at wrong fault; the stuck-at right fault refers to that a numerical value of a first bit in which the stuck-at fault is located is equal to a numerical value that needs to be written and that is corresponding to the first bit; and the stuck-at wrong fault refers to that a numerical value of a second bit in which the stuck-at fault is located is opposite to a numerical value that needs to be written and that is corresponding to the second bit.

The location numbers, in which a stuck-at fault occurs, in the 32 bits shown in Table 1 are 7, 9, 16, 17, and 27. With reference to Table 1 and Table 2, it may be learned that a numerical value of a bit whose location number is 7 in Table 1 is "0" that is equal to a numerical value "0" that needs to be written to this location in Table 2; therefore, a type of a stuck-at fault of the location number 7 is a stuck-at right fault. Similarly, it may be learned that a type of a stuck-at fault of the location number 9 is a stuck-at right fault, a type of a stuck-at fault of the location number 16 is a stuck-at wrong fault, a type of a stuck-at fault of the location number 17 is a stuck-at right fault, and a type of a stuck-at fault of the location number 27 is a stuck-at wrong fault.

For the foregoing grouping manner, although the location numbers 7 and 9 belong to the second group, types of stuck-at faults of both the location numbers 7 and 9 are stuck-at right faults, which meets the second grouping condition. The location numbers 16 and 17 belong to the fourth group, but types of stuck-at faults of the location numbers 16 and 17 are different, which does not meet the second grouping condition. Therefore, in this case, the foregoing grouping manner also needs to be adjusted, so as to re-group the 32 bits.

A method for determining re-grouping is similar to the foregoing method for performing re-grouping after determining is performed according to the first grouping condition; to prevent repetition, details are not described herein again. It may be learned from the foregoing analysis that a new grouping manner is as follows: Location numbers corresponding to the first group are 1, 7, 13, 19, and 25; location numbers corresponding to the second group are 6, 12, 18, 24, and 30; location numbers corresponding to the third group are 11, 17, 23, 29, and ○; location numbers corresponding to the fourth group are 16, 22, 28, □, and 5; location numbers corresponding to the fifth group are 21, 27, ◎, 4, and 10; location numbers corresponding to the sixth group are 26, 32, 3, 9, and 15; location numbers corresponding to the seventh group are 31, 2, 8, 14, and 20, where ◎, □, and ○ indicate that the locations are empty and successively represent the hypothesized location numbers 33, 34, and 35 in Table 3.

Further, it needs to determine whether the new groups meet the second grouping condition. The location numbers, in which a stuck-at fault occurs, in the 32 bits shown in Table 1 are 7, 9, 16, 17, and 27. With reference to the new grouping manner, it may be found that the location numbers in which the stuck-at fault occurs are 7, 9, 16, 17, and 27 that are respectively located in the first group, the sixth group, the fourth group, the third group, and the fifth group in the new groups. That is, the new grouping manner meets the second grouping condition: A type of a stuck-at fault included in each group is the same. Therefore, it may be determined that seven groups meeting the grouping condition are the new groups.

It should be noted that if it is assumed that the new groups still do not meet the second grouping condition, k may be continuously increased by 1, so as to obtain another new grouping manner, and it is further determined whether the another new grouping manner meets the second grouping condition.

It should be noted that in this embodiment of the present disclosure, a grouping manner determined according to the first grouping condition is independent of a grouping manner determined according to the second grouping condition. The grouping manners determined according to the two grouping conditions may be the same or may be different.

Still further, according to information about the stuck-at fault included in each group in the new groups, the 32 numerical values in Table 2 that need to be written are correspondingly written to the 32 bits in Table 1. Herein, the information about the stuck-at fault includes a location number of the stuck-at fault and the type of the stuck-at fault.

Optionally, as an embodiment, after the new groups are determined according to the first grouping condition, first, the type of the stuck-at fault included in each group is determined. The location numbers in which a stuck-at fault occurs are 7, 9, 16, 17, and 27 that are respectively located in the first group, the sixth group, the fourth group, the third group, and the fifth group in the new groups. It may be learned, by performing analysis with reference to Table 1 and Table 2, that types of stuck-at faults of the location numbers 7, 9, and 17 are stuck-at right faults, and types of stuck-at faults of the location numbers 16 and 27 are stuck-at wrong faults. Numerical values that need to be written and are corresponding to the fourth group and the fifth group are inverted and then written, where the fourth group and the fifth group are groups in which the stuck-at wrong faults are located; numerical values that need to be written and are corresponding to other groups are normally written. Numerical values of the 32 bits after the writing, that is, the written n numerical values, are shown in the third row in FIG. 4: after the n numerical values are written. In this way, the 32 location numbers and corresponding written numerical values after the writing may be shown in Table 5.

TABLE 5

| | Location number | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Written numerical value | 1 | 1 | 0 | 1 | 0 | 0 | 0 | 1 | 1 | 1 | 0 | 1 | 1 | 0 | 0 | 1 |
| | Location number | | | | | | | | | | | | | | | |
| | 17 | 18 | 19 | 20 | 21 | 22 | 23 | 24 | 25 | 26 | 27 | 28 | 29 | 30 | 31 | 32 |
| Written numerical value | 0 | 0 | 1 | 1 | 1 | 1 | 1 | 0 | 1 | 0 | 1 | 1 | 0 | 0 | 1 | 0 |

Alternatively, a flag bit $m_i$ may also be specified for each group in the new groups, where i indicates the $i^{th}$ group in the seven groups, and i is a positive integer not greater than 7. Correspondingly, the seven groups have seven flag bits, where a flag bit is used to indicate a type of a stuck-at fault included in a group. For example, 0 may be used to indicate a stuck-at right fault, and 1 may be used to indicate a stuck-at wrong fault. In this way, flag bits corresponding to the foregoing new groups are successively 0001100. Further, writing may be performed according to the flag bits corresponding to the groups. Furthermore, when a flag bit of a group is 1, a numerical value that needs to be written and that is corresponding to the group is inverted and then written; when a flag bit of a group is 0, a numerical value that needs to be written and that is corresponding to the group is normally written.

It should be noted that a form of the flag bit is not limited in the present disclosure. For example, the flag bit may be a vector m having B components, where the $i^{th}$ component of the vector is corresponding to a flag bit $m_i$ of the $i^{th}$ group of bits in B groups of bits. In addition, an initial value of the vector may be set to 0, and i is a positive integer not greater than B.

It should be noted that a specific write manner is not limited in this embodiment of the present disclosure. Optionally, writing may be performed according to the determined groups. For example, location numbers of the first group are 1, 7, 13, 19, and 25, and a type of a stuck-at fault included in the first group is a stuck-at right fault or a flag bit of the first group is 0, numerical values corresponding to the location numbers 1, 7, 13, 19, and 25 are normally written. Then, writing is implemented in sequence from the second group to the seventh group. Optionally, writing may also be performed in a sequence of location numbers. For example, for the location number 1, first, it is determined that a group to which the location number 1 belong is the first group, and a type of a stuck-at fault included in the first group is a stuck-at right fault or a flag bit of the first group is 0, a numerical value corresponding to the location number 1 is normally written. Then, for the location number 2, first, it is determined that a group to which the location number 2 belongs is the seventh group, and the seventh group does not include a stuck-at fault or the flag bit of the seven group is 0, a numerical value corresponding to the location number 2 is normally written. Afterward, writing is implemented in sequence from the location number 3 to the location number 32. Alternatively, writing may also be performed in an inverse sequence of location numbers. Writing may also be implemented in another manner. A person skilled in the art can understand that implementing writing in another manner still falls within the scope of this embodiment of the present disclosure.

Optionally, as another embodiment, after the new groups are determined according to the second grouping condition, it may be learned that types of stuck-at faults included in the fourth group and the fifth group in the new groups are stuck-at wrong faults, and types of stuck-at faults included in other groups are stuck-at right faults or the other groups do not include a stuck-at fault. Numerical values that need to be written and are corresponding to the groups in which the stuck-at wrong faults are located are inverted and then written; numerical values that need to be written and are corresponding to the other groups are normally written. In this way, the numerical values of the 32 bits after the writing may be shown in Table 5.

Similarly, a flag bit corresponding to each group may also be introduced; further, writing is performed according to the flag bit. For specific descriptions of the flag bit, refer to the foregoing descriptions for the first grouping condition. To prevent repetition, details are not described herein again.

Figure 5:
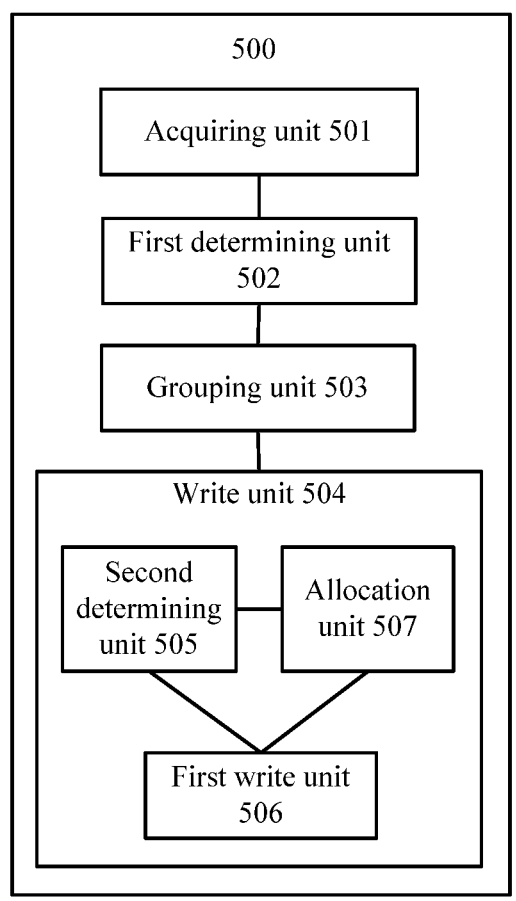
FIG. 5 is a simplified block diagram of a write apparatus for a storage device according to an embodiment of the present disclosure.

FIG. 5 is a block diagram of a write apparatus for a storage device according to an embodiment of the present disclosure. A write apparatus 500 shown in FIG. 5 includes an acquiring unit 501, a first determining unit 502, a grouping unit 503, and a write unit 504.

The acquiring unit 501 is configured to acquire n numerical values that need to be written.

The first determining unit 502 is configured to determine n bits corresponding to the n numerical values that need to be written, and information about a stuck-at fault included in the n bits, where the information about the stuck-at fault includes a location of the stuck-at fault in the n bits and a numerical value of a bit in which the stuck-at fault is located.

The grouping unit 503 is configured to group the n bits into B groups of bits, so that the B groups of bits meet a grouping condition, and when the n bits represent a two-dimensional array of B rows and A columns, any two bits that belong to a same group in the n bits are in different rows and columns or any two bits that belong to a same group in the n bits are in a same row, where the grouping condition is used to limit a stuck-at fault included in each group of bits in the B groups of bits.

The write unit 504 is configured to correspondingly write, to the n bits according to information about the stuck-at fault included in each group of bits in the B groups of bits and a numerical value that needs to be written and that is corresponding to a bit in which the stuck-at fault is located, the n numerical values that need to be written, where n, A, and B are positive integers, and n≤A×B.

In this embodiment of the present disclosure, it is determined, by adjusting an interval between two adjacent bits in a same group, that n bits are grouped into B groups, and numerical values that need to be written can be correspondingly written to the n bits according to information about a stuck-at fault in each group of the B groups, so that a write error caused by a stuck-at fault in an impedance storage device can be effectively prevented.

Optionally, as an embodiment, the grouping unit 502 is specifically configured to group the n bits into the B groups of bits, so that when the n bits represent the two-dimensional array of B rows and A columns, a location, of the $j^{th}$ bit in the $i^{th}$ group of bits in the B groups of bits, in the two-dimensional array of B rows and A columns meets: $p_{i,j+1}=p_{i,j}+1$ and $q_{i,j+1}=(q_{i,j}+k) \bmod B$; and adjust a value of k, so that the B groups of bits meet the grouping condition, where $p_{i,j}$ is a column number, of the $j^{th}$ bit in the $i^{th}$ group of bits in the B groups of bits, in the two-dimensional array, $q_{i,j}$ is a row number, of the $j^{th}$ bit in the $i^{th}$ group of bits in the B groups of bits, in the two-dimensional array, i and $q_{i,j}$ are positive integers not greater than B, j and $p_{i,j}$ are are positive integers not greater than A, k is a non-negative integer less than B, and the adjusting a value of k includes increasing the value of k by 1, where B is a minimum prime number not less than $\sqrt{n}$, and $$A = \lceil \frac{n}{B} \rceil.$$

Optionally, as an embodiment, the grouping condition is that: A quantity of stuck-at faults included in each group of bits in the B groups of bits does not exceed one.

Optionally, as another embodiment, the grouping condition is that: A type of the stuck-at fault included in each group of bits in the B groups of bits is the same, where the type of the stuck-at fault includes a stuck-at right fault and a stuck-at wrong fault; the stuck-at right fault refers to that a numerical value of a first bit in which the stuck-at fault is located is equal to a numerical value that needs to be written and that is corresponding to the first bit; and the stuck-at wrong fault refers to that a numerical value of a second bit in which the stuck-at fault is located is opposite to a numerical value that needs to be written and that is corresponding to the second bit.

Optionally, as an embodiment, the write unit 504 includes a second determining unit 505 and a first write unit 506. The second determining unit 505 is configured to determine, according to the information about the stuck-at fault included in each group of bits in the B groups of bits and the numerical value that needs to be written and that is corresponding to the bit in which the stuck-at fault is located, the type of the stuck-at fault included in each group of bits in the B groups of bits. The first write unit 506 is configured to correspondingly write, to the n bits according to the B groups of bits and the type of the stuck-at fault included in each group of bits in the B groups of bits, the n numerical values that need to be written.

Optionally, as another embodiment, the first write unit 506 is specifically configured to: when a type of a stuck-at fault included in the $i^{th}$ group of bits in the B groups of bits is a stuck-at wrong fault, correspondingly invert a numerical value that needs to be written and that is corresponding to the $i^{th}$ group of bits, and write a numerical value obtained after the inversion to the $i^{th}$ group of bits, where i is a positive integer not greater than B.

Optionally, as another embodiment, the write unit 504 further includes an allocation unit 507, where the allocation unit 507 is configured to allocate a flag bit $m_i$ to the $i^{th}$ group of bits in the B groups of bits, where $m_i$ is used to indicate a type of a stuck-at fault included in the $i^{th}$ group of bits in the B groups of bits. The first write unit 506 is specifically configured to correspondingly write, to the $i^{th}$ group of bits according to the flag bit $m_i$, a numerical value that needs to be written and that is corresponding to the $i^{th}$ group of bits, where i is a positive integer not greater than B.

Furthermore, when the flag bit indicates that the type of the stuck-at fault included in the $i^{th}$ group in the B groups is a stuck-at wrong fault, the numerical value that needs to be written and that is corresponding to the $i^{th}$ group is inverted and then written.

Alternatively, Furthermore, when the flag bit $m_i=1$, the numerical value that needs to be written and that is corresponding to the $i^{th}$ group of bits is inverted and then written to the $i^{th}$ group of bits, where the flag bit $m_i=1$ indicates that the type of the stuck-at fault included in the $i^{th}$ group of bits in the B groups of bits is a stuck-at wrong fault.

The write apparatus 500 is capable of implementing all processes implemented by the write apparatus in the embodiments of FIG. 2 to FIG. 4. To prevent repetition, details are not described herein again.

Figure 6:
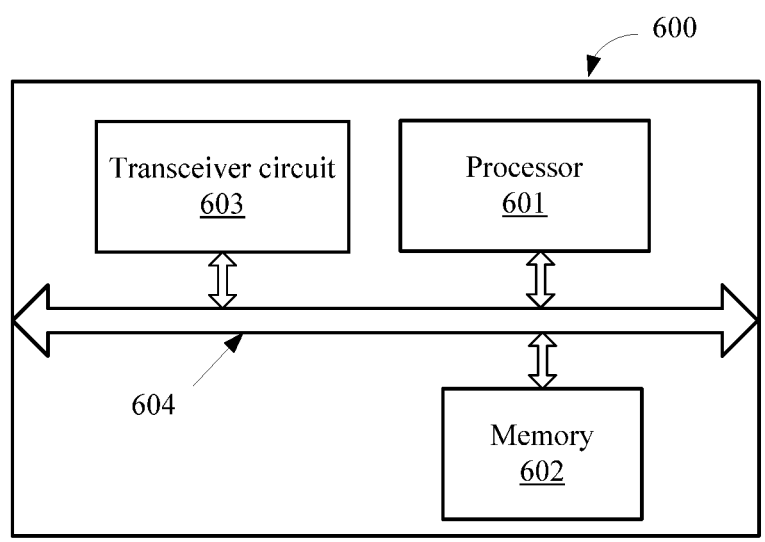
FIG. 6 is a simplified block diagram of a write apparatus for a storage device according to an embodiment of the present disclosure.

FIG. 6 is a block diagram of a write apparatus for a storage device according to an embodiment of the present disclosure. A write apparatus 600 shown in FIG. 6 includes a processor 601, a storage 602, and a transceiver circuit 603.

The transceiver circuit 603 is configured to acquire n numerical values that need to be written.

The processor 601 is configured to determine n bits corresponding to the n numerical values that need to be written, and information about a stuck-at fault included in the n bits, where the information about the stuck-at fault includes a location of the stuck-at fault in the n bits and a numerical value of a bit in which the stuck-at fault is located; configured to group the n bits into B groups of bits, so that the B groups of bits meet a grouping condition, and when the n bits represent a two-dimensional array of B rows and A columns, any two bits that belong to a same group in the n bits are in different rows and columns or any two bits that belong to a same group in the n bits are in a same row, where the grouping condition is used to limit a stuck-at fault included in each group of bits in the B groups of bits; and configured to correspondingly write, to the n bits according to information about the stuck-at fault included in each group of bits in the B groups of bits and a numerical value that needs to be written and that is corresponding to a bit in which the stuck-at fault is located, the n numerical values that need to be written, where n, A, and B are positive integers, and n≤A×B.

In this embodiment of the present disclosure, it is determined, by adjusting an interval between two adjacent bits in a same group, that n bits are grouped into B groups, and numerical values that need to be written can be correspondingly written to the n bits according to information about a stuck-at fault in each group of the B groups, so that a write error caused by a stuck-at fault in an impedance storage device can be effectively prevented.

All components of the write apparatus 600 are coupled together using a bus system 604, where the bus system 604 may include a power bus, a control bus, and a status signal bus in addition to a data bus. However, for clarity of description, various buses are marked as the bus system 604 in FIG. 6.

The methods disclosed in the foregoing embodiments of the present disclosure may be applied to the processor 601, or implemented by the processor 601. The processor 601 may be an integrated circuit chip and has a signal processing capability. In an implementation process, the steps in the foregoing methods may be implemented by an integrated logic circuit of hardware in the processor 601 or an instruction in a form of software. The processor 601 may be a general purpose processor, a digital signal processor (DSP), an application-specific integrated circuit (ASIC), a field programmable gate array (FPGA) or another programmable logical device, discrete gate or a transistor logical device, or discrete hardware component; and can implement or execute the methods, the steps, and the logical block diagrams disclosed in the embodiments of the present disclosure. The general purpose processor may be a microprocessor, or the processor may also be any conventional processor and the like. The steps of the methods disclosed with reference to the embodiments of the present disclosure may be directly executed and accomplished by a hardware decoding processor, or may be executed and accomplished using a combination of hardware and software modules in the decoding processor. The software module may be located in a mature storage medium in the art, such as a random access memory (RAM), a flash memory, a read-only memory (ROM), a programmable read-only memory, an electrically-erasable programmable memory, or a register. The storage medium is located in the storage 602. The processor 601 reads information from the storage 602, and implements the steps of the foregoing methods in combination with the hardware.

Optionally, as an embodiment, the processor 601 is specifically configured to group the n bits into the B groups of bits, so that when the n bits represent the two-dimensional array of B rows and A columns, a location, of the $j^{th}$ bit in the $i^{th}$ group of bits in the B groups of bits, in the two-dimensional array of B rows and A columns meets: $p_{i,j+1} = p_{i,j} + 1$ and $q_{i,j+1} = (q_{i,j} + k) \mod B$; and adjust a value of k, so that the B groups of bits meet the grouping condition, where $p_{i,j}$ is a column number, of the $j^{th}$ bit in the $i^{th}$ group of bits in the B groups of bits, in the two-dimensional array, $q_{i,j}$ is a row number, of the $j^{th}$ bit in the $i^{th}$ group of bits in the B groups of bits, in the two-dimensional array, i and $q_{i,j}$ are positive integers not greater than B, j and $p_{i,j}$ are positive integers not greater than A, k is a non-negative integer less than B, and the adjusting a value of k includes increasing the value of k by 1, where B is a minimum prime number not less than $\sqrt{n}$, and $$A = \lceil \frac{n}{B} \rceil.$$

Optionally, as an embodiment, the grouping condition is that: A quantity of stuck-at faults included in each group of bits in the B groups of bits does not exceed one.

Optionally, as another embodiment, the grouping condition is that: A type of the stuck-at fault included in each group of bits in the B groups of bits is the same, where the type of the stuck-at fault includes a stuck-at right fault and a stuck-at wrong fault; the stuck-at right fault refers to that a numerical value of a first bit in which the stuck-at fault is located is equal to a numerical value that needs to be written and that is corresponding to the first bit; and the stuck-at wrong fault refers to that a numerical value of a second bit in which the stuck-at fault is located is opposite to a numerical value that needs to be written and that is corresponding to the second bit.

Optionally, as an embodiment, the processor 601 is specifically configured to determine, according to the information about the stuck-at fault included in each group of bits in the B groups of bits and the numerical value that needs to be written and that is corresponding to the bit in which the stuck-at fault is located, the type of the stuck-at fault included in each group of bits in the B groups of bits; and Correspondingly write, to the n bits according to the B groups of bits and the type of the stuck-at fault included in each group of bits in the B groups of bits, the n numerical values that need to be written.

Optionally, as another embodiment, the processor 601 is configured to: when a type of a stuck-at fault included in the $i^{th}$ group of bits in the B groups of bits is a stuck-at wrong fault, correspondingly invert a numerical value that needs to be written and that is corresponding to the $i^{th}$ group of bits, and write a numerical value obtained after the inversion to the $i^{th}$ group of bits, where i is a positive integer not greater than B.

Optionally, as another embodiment, the processor 601 is specifically configured to allocate a flag bit $m_i$ to the $i^{th}$ group of bits in the B groups of bits, where $m_i$ is used to indicate a type of a stuck-at fault included in the $i^{th}$ group of bits in the B groups of bits; and correspondingly write, to the $i^{th}$ group of bits according to the flag bit $m_i$, a numerical value that needs to be written and that is corresponding to the $i^{th}$ group of bits, where i is a positive integer not greater than B.

Furthermore, when the flag bit indicates that the type of the stuck-at fault included in the $i^{th}$ group in the B groups is a stuck-at wrong fault, the numerical value that needs to be written and that is corresponding to the $i^{th}$ group is inverted and then written.

Alternatively, Furthermore, when the flag bit $m_i=1$, the numerical value that needs to be written and that is corresponding to the $i^{th}$ group of bits is inverted and then written to the $i^{th}$ group of bits, where the flag bit $m_i=1$ indicates that the type of the stuck-at fault included in the $i^{th}$ group of bits in the B groups of bits is a stuck-at wrong fault.

The write apparatus 600 is capable of implementing all processes implemented by the write apparatus in the embodiments of FIG. 2 to FIG. 4. To prevent repetition, details are not described herein again.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the embodiment of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present disclosure. The foregoing storage medium includes: any medium that can store program code, such as a USB flash drive, a removable hard disk, a ROM, a RAM, a magnetic disk, or an optical disc.

The foregoing descriptions are merely specific implementation manners of the present disclosure, but are not intended to limit the protection scope of the present disclosure. Any variation or replacement readily figured out by a person skilled in the art within the technical scope disclosed in the embodiments of the present disclosure shall fall within the protection scope of the present disclosure. Therefore, the protection scope of the present disclosure shall be subject to the protection scope of the claims.

What is claimed is:

1. A write method for a storage device, the method comprising:
   determining n bits in the storage device, each bit corresponding to one of n numerical values to be written to the storage device, wherein the n bits include stuck-at fault bits, each stuck-at fault bit associated with a permanent numerical value, wherein types of a stuck-at fault bit comprise a stuck-at right fault and a stuck-at wrong fault, wherein a permanent numerical value of a stuck-at fault bit having a type of the stuck-at right fault corresponds to a numerical value to be written to the stuck-at fault bit of the stuck-at right fault, and wherein a permanent numerical value of a stuck-at fault bit having a type of the stuck-at wrong fault is opposite to a numerical value to be written to the stuck-at fault bit of the stuck-at wrong fault;
   grouping the n bits into B groups according to the stuck-at fault bits, wherein each group comprises at most A bits, including zero or more of the stuck-at fault bits, wherein each group of the n bits is grouped with one of the types of the stuck-at fault, and wherein stuck-at fault bits in each group are of a same type corresponding to the one type of the stuck-at fault with the group; and
   writing numerical values into bits of the group according to the one type of the stuck-at fault with the group;
   wherein n, A, and B are positive integers, and n≤A×B.

2. The write method according to claim 1, wherein the grouping the n bits into B groups comprises:
   generating an array of B rows and A columns to represent the n bits, wherein the B groups are obtained based on the array, and wherein any two of the n bits that belong to a same group are represented in different rows and columns, or any two bits that belong to a same group are represented in a same row.

3. The write method according to claim 2, wherein the array of B rows and A columns corresponds to a two-dimensional array, wherein a location of a $j^{th}$ bit of an $i^{th}$ group in the B groups in the array of B rows and A columns is represented by a column number $p_{i,j}$ and a row number $q_{i,j}$ of the two-dimensional array, i and $q_{i,j}$ being positive integers not greater than B, j, and $p_{i,j}$ being positive integers not greater than A, wherein a location of a $(j+1)^{th}$ bit of the $i^{th}$ group in the B groups is represented by a column number $p_{i,j+1}$ and a row number $q_{i,j+1}$ and wherein locations of the $j^{th}$ bit and the $(j+1)^{th}$ bit are related according to:

$$p_{i,j+1}=p_{i,j}+1 \text{ and } q_{i,j+1}=(q_{i,j}+k) \bmod B,$$

wherein k is a non-negative integer less than B, wherein B is a minimum prime number not less than $\sqrt{n}$, and $$A = \lceil \frac{n}{B} \rceil,$$

and wherein the grouping comprises adjusting the k so that the quantity of the stuck-at fault bits in each group is no more than A and the stuck-at fault bits in each group are of the same type.

4. The write method according to claim 1, wherein the writing numerical values comprises:
   inverting the numerical values wherein the one type of the stuck-at fault with the group is the stuck-at wrong fault, and wherein the bits of the group are written with the inverted numerical values.

5. The write method according to claim 1, wherein the one type of the stuck-at fault with the group is the stuck-at right fault and wherein the bits of the group are written with the numerical values without inversion.

6. The write method according to claim 1, wherein the writing numerical values comprises:

allocating a flag bit to the group, wherein the flag bit indicates the one type of the stuck-at fault with the group, wherein the numerical values are written according to the flag bit.

7. The write method according to claim 6, wherein the flag bit represents the stuck-at wrong fault, wherein the numerical values are inverted and the inverted numerical values are written to the bits of the group.

8. A storage device, comprising:
a storage controller, and a storage medium, wherein the storage medium is configured to store numerical values, wherein the storage controller comprises a transceiver circuit and a processor,
wherein the transceiver circuit is configured to acquire n numerical values that need to be written, and wherein the processor is configured to:
determine n bits in the storage device, each bit corresponding to one of the n numerical values to be written, wherein the n bits include stuck-at fault bits, wherein types of a stuck-at fault bit comprises a stuck-at right fault and a stuck-at wrong fault, wherein a permanent numerical value of a stuck-at fault bit having a type of the stuck-at right fault is equal to a numerical value to be written to the stuck-at fault bit of the stuck-at right fault, and wherein a permanent numerical value of a stuck-at fault bit having a type of the stuck-at wrong fault is opposite to a numerical value to be written to the stuck-at fault bit of the stuck-at wrong fault;
group the n bits into B groups according to the stuck-at fault bits, wherein each group comprises at most A bits including zero or more of the stuck-at fault bits, wherein each group of the n bits is grouped with one of the types of the stuck-at fault, and wherein stuck-at fault bits in each group are of a same type corresponding to the one type of the stuck-at fault with the group; and
write numerical values into bits of the group according to the one type of the stuck-at fault with the group; wherein n, A, and B are positive integers, and n≤A×B.

9. The storage device according to claim 8, wherein the processor is further configured to:
generate an array of B rows and A columns to represent the n bits, wherein the B groups are obtained based on the array, and wherein any two bits that belong to a same group are represented in different rows and columns, or any two bits that belong to a same group are represented in a same row.

10. The write apparatus according to claim 9, wherein the array of B rows and A columns corresponds to a two-dimensional array, wherein a location of a $j^{th}$ bit of an $i^{th}$ group in the B groups in the array of B rows and A columns is represented by a column number $p_{i,j}$ and a row number $q_{i,j}$ of the two-dimensional array, i and $q_{i,j}$ being positive integers not greater than B, j and $p_{i,j}$ being positive integers not greater than A, wherein a location of a $(j+1)^{th}$ bit of the $i^{th}$ group in the B groups is represented by a column number $p_{i,j+1}$ and a row number $q_{i,j+1}$ and wherein locations of the $j^{th}$ bit and the $(j+1)^{th}$ bit are related according to $p_{i,j+1}=p_{i,j}+1$ and $q_{i,j+1}=(q_{i,j}+k) \bmod B$, wherein k is a non-negative integer less than B, wherein B is a minimum prime number not less than $\sqrt{n}$, and $$A = \lceil \frac{n}{B} \rceil$$

and wherein the grouping comprises adjusting the k so that the quantity of the stuck-at fault bits in each group is no more than A and the stuck-at fault bits in each group are of the same type.

11. The write apparatus according to claim 8, wherein the processor is further configured to:
invert the numerical values when the one type of the stuck-at fault with the group is the stuck-at wrong fault.

12. The write apparatus according to claim 8, wherein processor is configured to:
write the numerical values without inversion to the group when the one type of the stuck-at fault with the group is the stuck-at right fault.

13. The write apparatus according to claim 8, wherein the processor is further configured to:
allocate a flag bit to the group, wherein the flag bit indicates the one type of the stuck-at fault with the group wherein the numerical values are written according to the flag bit.

14. The write apparatus according to claim 13, wherein when the flag bit represents the stuck-at wrong fault, the numerical values are inverted and the inverted numerical values are written to the bits of the group.

* * * * *